United States Patent
Tian et al.

(10) Patent No.: US 9,810,717 B2
(45) Date of Patent: Nov. 7, 2017

(54) DEVICE FOR MEASURING AT LEAST ONE ELECTRIC QUANTITY OF A CURRENT INTENDED TO CIRCULATE IN AN ELECTRIC APPARATUS, AND ASSEMBLY COMPRISING SUCH A DEVICE

(71) Applicant: Schneider Electric Industries SAS, Rueil-Malmaison (FR)

(72) Inventors: Simon Tian, Eybens (FR); Didier Vigouroux, Brignoud (FR); Yannick Neyret, Biviers (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 316 days.

(21) Appl. No.: 14/644,736

(22) Filed: Mar. 11, 2015

(65) Prior Publication Data
US 2015/0309084 A1    Oct. 29, 2015

(30) Foreign Application Priority Data
Apr. 24, 2014   (FR) ...................... 14 53707

(51) Int. Cl.
*G01R 33/02*   (2006.01)
*G01R 15/18*   (2006.01)

(52) U.S. Cl.
CPC ............ *G01R 15/18* (2013.01); *G01R 15/181* (2013.01)

(58) Field of Classification Search
CPC ........ G01V 3/00; G01V 3/165; G01D 5/2046; G01D 5/2053
See application file for complete search history.

(56) References Cited

U.S. PATENT DOCUMENTS 4,001,684 A * 1/1977 Fritts ...................... G01R 1/203
324/126
6,018,239 A * 1/2000 Berkcan ............... G01R 15/181
324/127

(Continued)

FOREIGN PATENT DOCUMENTS

FR    2 990 759 A1    11/2013
WO    WO 2008/042483 A1    4/2008

OTHER PUBLICATIONS

French Preliminary Search Report dated Jan. 9, 2015 in French Application 14 53707, filed on Apr. 24, 2014 ( with English Translation of Categories of Cited Documents).

*Primary Examiner* — Tung X Nguyen
*Assistant Examiner* — Dominic Hawkins
(74) *Attorney, Agent, or Firm* — Oblon, McClelland, Maier & Neustadt, L.L.P.

(57) ABSTRACT

Device for measuring at least one electrical variable of a current intended to flow in an electric apparatus, the electric apparatus comprising at least one connection terminal, each connection terminal being designed to be electrically connected to the end of a corresponding electric conductor, the device comprising at least one current sensor, each current sensor being configured for measuring the current flowing in a corresponding electric conductor. The device further comprises at least one electrically conductive spacer, each spacer being configured for being interposed between a respective connection terminal and the end of a corresponding electric conductor, and wherein each current sensor is further positioned around a respective spacer, to measure the current flowing through said spacer, between the electric conductor and the corresponding connection terminal.

14 Claims, 8 Drawing Sheets

(56) References Cited

U.S. PATENT DOCUMENTS

| | | | | |
|---|---|---|---|---|
| 6,217,370 B1* | 4/2001 | Scheel | ............... | H01R 13/6335 |
| | | | | 439/483 |
| 6,845,166 B2* | 1/2005 | Hara | ................. | H04R 7/04 |
| | | | | 381/399 |
| 6,940,266 B2* | 9/2005 | Roden | ................ | G01R 1/203 |
| | | | | 324/126 |
| 8,560,256 B2* | 10/2013 | Gu | ................. | G01D 4/002 |
| | | | | 702/116 |
| 8,666,685 B2* | 3/2014 | Paik | ................. | G01D 4/004 |
| | | | | 324/117 H |
| 8,970,246 B2* | 3/2015 | Hickam | .............. | G01R 1/203 |
| | | | | 324/522 |
| 2003/0222739 A1* | 12/2003 | Kolberg | ............. | H01H 1/5822 |
| | | | | 335/35 |
| 2005/0253573 A1 | 11/2005 | Budillon et al. | | |
| 2008/0082276 A1* | 4/2008 | Rivers | ............... | G01R 22/063 |
| | | | | 702/62 |
| 2011/0242768 A1* | 10/2011 | Lu | ................. | H05K 5/023 |
| | | | | 361/726 |
| 2012/0016496 A1* | 1/2012 | Kim | ................. | G08B 13/19 |
| | | | | 700/14 |
| 2012/0182708 A1* | 7/2012 | Juge | ................ | H02B 13/0356 |
| | | | | 361/807 |
| 2013/0314083 A1 | 11/2013 | Loglisci | | |
| 2014/0125318 A1* | 5/2014 | Fries | ................ | B61L 5/1881 |
| | | | | 324/126 |

\* cited by examiner

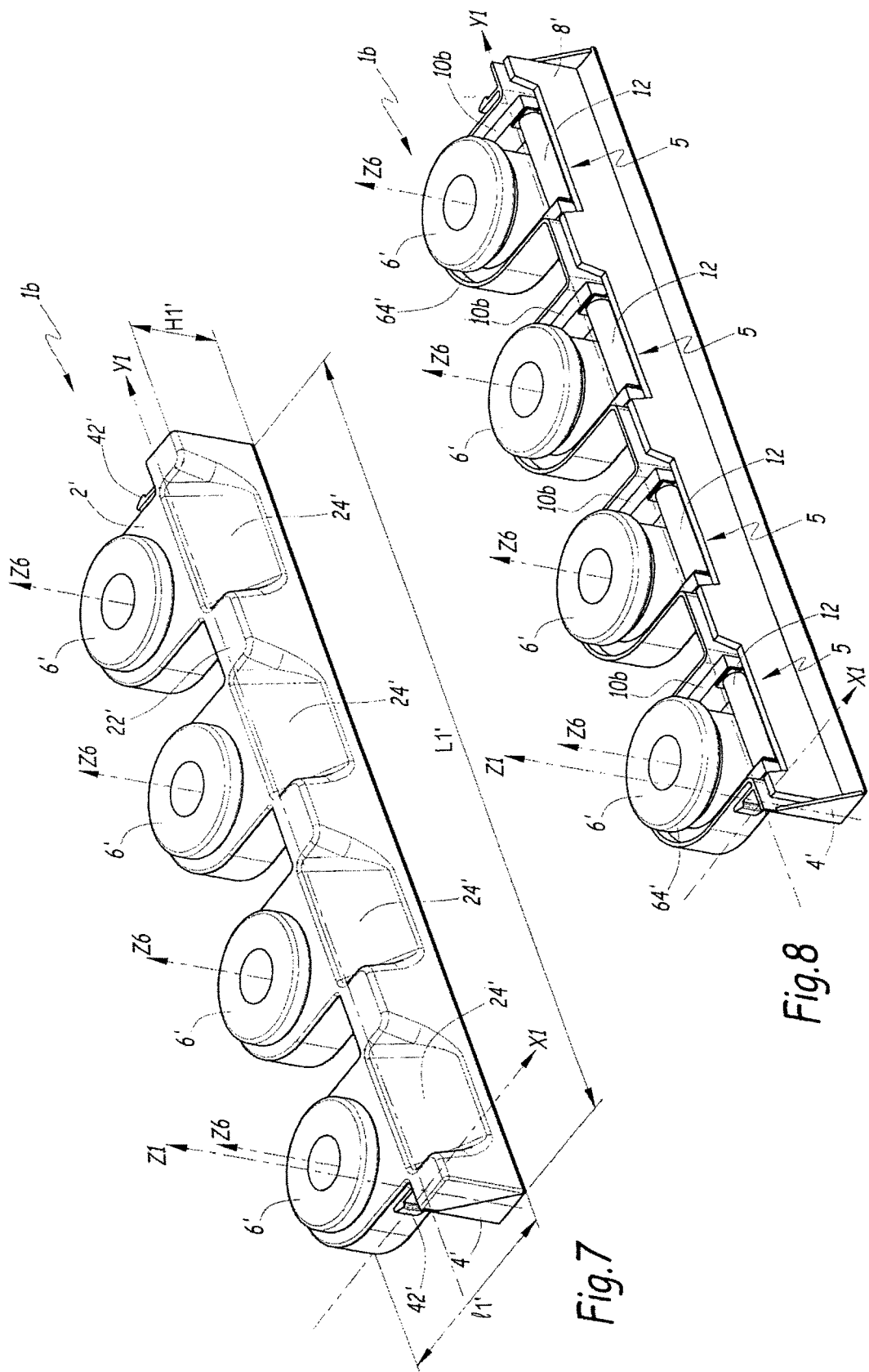

DEVICE FOR MEASURING AT LEAST ONE ELECTRIC QUANTITY OF A CURRENT INTENDED TO CIRCULATE IN AN ELECTRIC APPARATUS, AND ASSEMBLY COMPRISING SUCH A DEVICE

BACKGROUND OF THE INVENTION

The present invention relates to a device for measuring at least one electric variable of a current intended to flow in an electric apparatus. The invention also relates to an assembly comprising an electric apparatus and one such measuring device according to the invention.

It is known to manufacture measuring devices making it possible to measure electrical properties of a current passing through a circuit breaker, those measuring devices also being called electricity meters when they make it possible furthermore to calculate the electricity associated with a given current. Thus, document FR 2,977,323 A1 describes a measuring module provided for low-caliber circuit breakers and usable to update an existing electrical installation. This module comprises through holes making it possible to mount it around at least one electric conductor connected to the circuit breaker. Furthermore, it is known from document WO-2008/042483 A1 to manufacture a measuring module whose current sensor does not completely cover the conductor. However, with such a sensor, the measurement is sensitive to a lateral parasitic field. Furthermore, document EP 1,684,080 A1 reveals the use of an independent sensor mounted on each phase, self-powered by the current that passes through the conductor and communicating the value of the measured current by radio.

These different measuring systems measure electrical properties of a current flowing in the circuit breaker by positioning at least one current sensor around at least one electric conductor connected to the circuit breaker. The mounting of such measuring devices is therefore necessarily done in at least two steps, a first step consisting of fastening the electric conductor(s) on each terminal of the circuit breaker, after having passed them through the measuring module. A second step consists of fastening the measuring module to the circuit breaker. The installation of these measuring modules is therefore relatively complex, may cause mounting errors and may be made difficult by a lack of space.

SUMMARY OF THE INVENTION

The invention more particularly aims to resolve these drawbacks by proposing a device for measuring at least one electrical variable of a current intended to flow in an electric apparatus, that is easier to assemble with the electric apparatus.

To that end, the invention relates to a device for measuring at least one electrical variable of a current intended to flow in an electric apparatus, the electric apparatus comprising at least one connection terminal, each connection terminal being designed to be electrically connected to the end of a corresponding electric conductor, the measuring device comprising at least one current sensor, each current sensor being configured for measuring the current flowing in a corresponding electric conductor. This measuring device further comprises at least one electrically conductive spacer, each spacer being configured for being inserted between a respective connection terminal and the end of a corresponding electric conductor, and wherein each current sensor is further positioned around a respective spacer, to measure the current flowing through said spacer, between the electric conductor and the corresponding connection terminal.

Owing to the invention, the measuring device is easy to assemble to the electric apparatus and is suitable for any type of section of the electric conductor.

According to other advantageous and optional aspects of the invention, such a measuring device comprises one or more of the following technical features, considered alone or according to any technically possible combination:
- the electric apparatus comprises N connection terminals, N being an integer greater than or equal to 2, and wherein the measuring device comprises N current sensors and N spacers;
- at least one current sensor comprises a magnetic circuit and a coil, the coil being positioned between two ends of the magnetic circuit;
- the magnetic circuits are formed by a single piece in the form of a boustrophedon;
- at least one current sensor comprises a winding coiled in the shape of a toroid, such as a Rogowski toroid;
- the measuring device comprises at least one voltage sensor configured for measuring the voltage of a corresponding connection terminal;
- each voltage sensor is in the form of a tongue positioned against a respective spacer;
- each spacer comprises a passage orifice for a connection member connecting the end of the conductor to the corresponding connection terminal;
- the device comprises means for wirelessly sending the measured electrical variable(s) to an electronic equipment that is remote from said device; and
- the device comprises elastic fitting means with complementary means of the electric apparatus, to fasten the device to the electric apparatus.

The invention also relates to an assembly comprising an electric apparatus and a measuring device as defined above.

According to other advantageous and optional aspects of the invention, such an assembly comprises one or more of the following technical features, considered alone or according to any technically possible combination:
- the electric apparatus is an electric cutoff or electric protection apparatus; and
- the electric apparatus is an electric circuit breaker.

BRIEF DESCRIPTION OF THE DRAWINGS

The invention will be better understood, and other advantages thereof will appear upon reading the following description, provided solely as a non-limiting example, and done in reference to the appended drawings, in which:

FIG. 6 is a view similar to that of FIG. 4 according to a second embodiment of the invention;

FIG. 7 is a view similar to that of FIG. 2 according to a third embodiment;

FIG. 8 is a view similar to that of FIG. 4 according to the third embodiment;

DETAILED DESCRIPTION OF PREFERRED EMBODIMENTS

Figure 1:
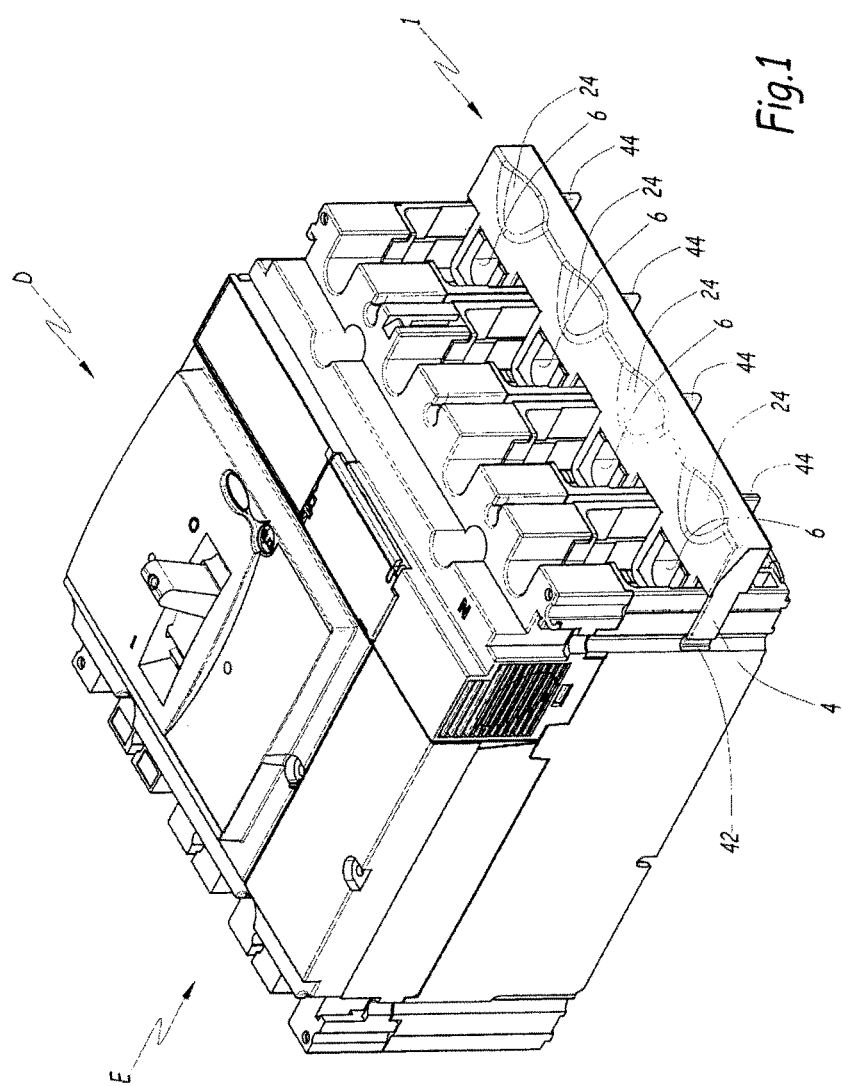
FIG. 1 is a perspective top view of an assembly comprising a circuit breaker and a measuring device according to a first embodiment of the invention.

The invention relates to a measuring device 1, configured for being mounted on an electric apparatus. In the example embodiment of the invention described below, the electric apparatus is a four-pole circuit breaker D, comprising four connection terminals. An assembly E formed by the measuring device 1 mounted on the circuit breaker D is shown in FIG. 1.

Figure 2:
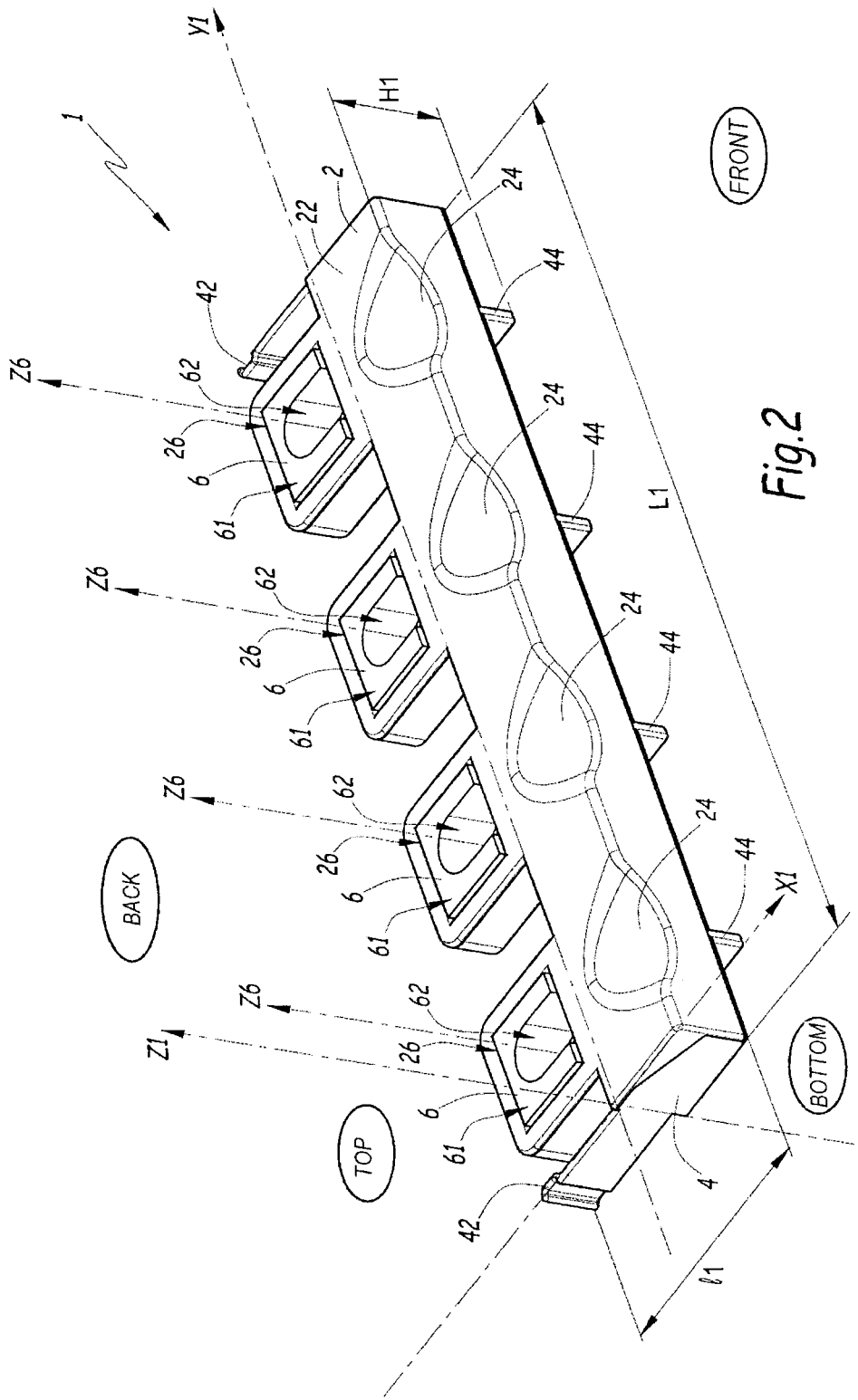
FIG. 2 is a perspective top view of the measuring device of FIG. 1, the device in particular comprising a protective cover.
Figure 3:
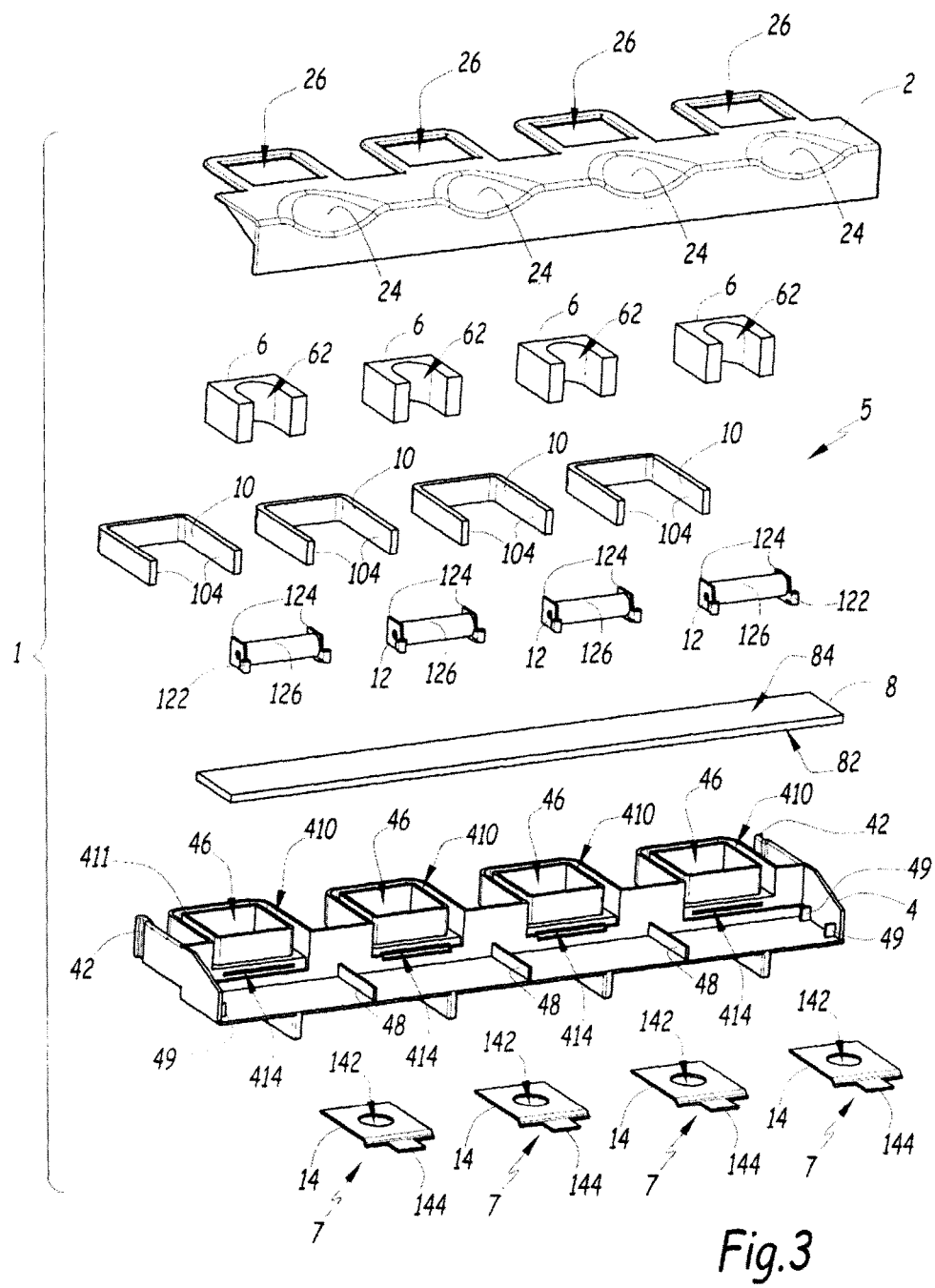
FIG. 3 is an exploded perspective view of the measuring device of FIG. 1.
Figure 4:
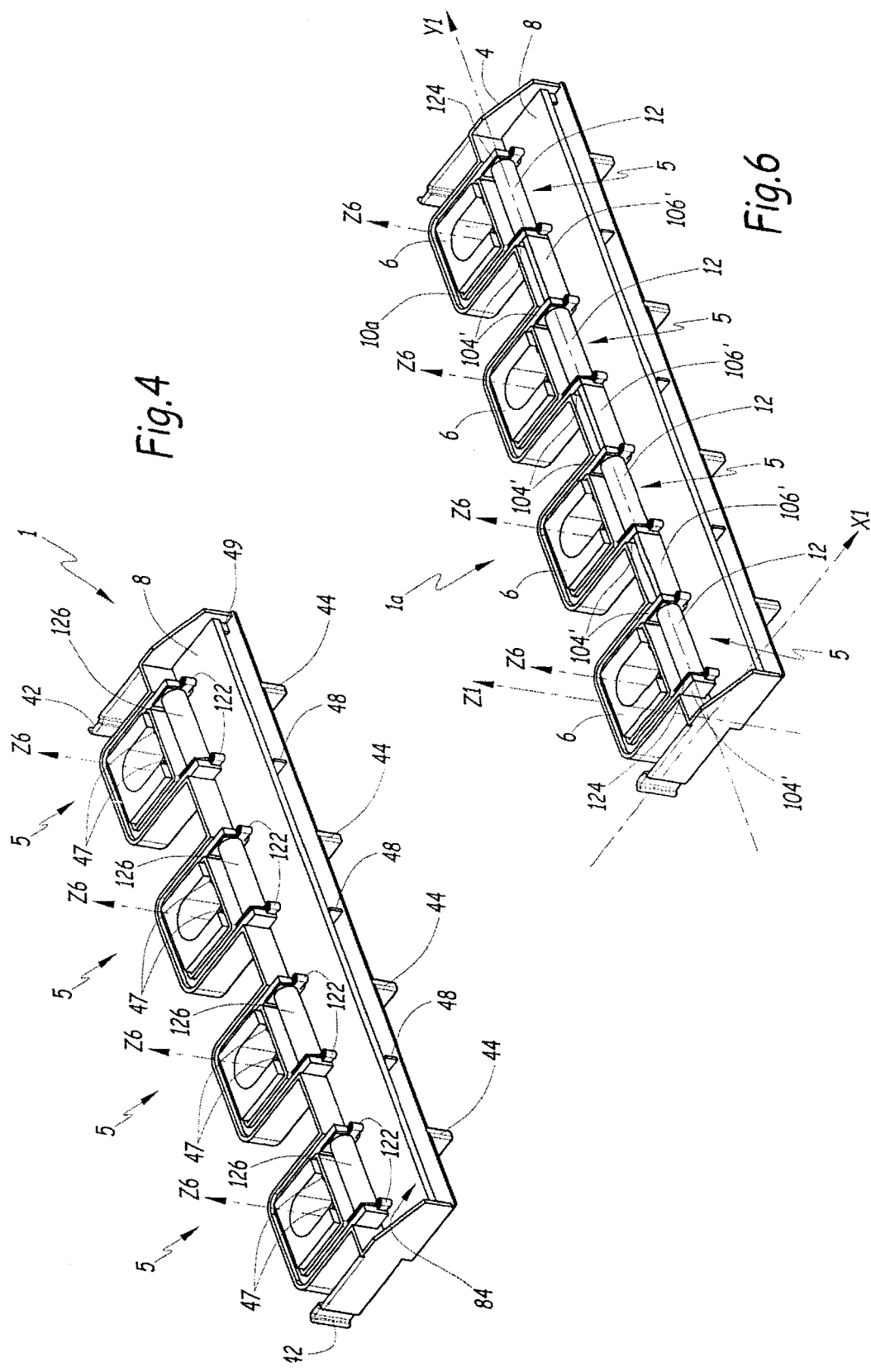
FIG. 4 is a perspective top view of the device of FIG. 1 without its protective cover.

FIG. 2 shows the measuring device 1, the latter comprising a protective cover 2 covering a housing 4. The measuring device 1 also comprises at least one current sensor 5, shown in an exploded view in FIG. 3, and at least one electrically conductive spacer 6, configured for being interposed between a connection terminal of the electric apparatus and the end of the electric conductor designed to be electrically connected to said connection terminal. The current sensor 5 is positioned around a corresponding spacer 6 and is configured for measuring the current flowing through said spacer 6, between the electric conductor and the corresponding connection terminal.

Optionally and additionally, the measuring device 1 comprises at least one voltage sensor 7, positioned against a corresponding spacer 6 and configured for measuring the voltage at the corresponding connection terminal.

The measuring device 1 being configured for being mounted on the four-pole circuit breaker D, it then preferably comprises four current sensors 5 and four spacers 6. Optionally and additionally, the measuring device 1 comprises four voltage sensors 7.

The measuring device 1 is globally in the shape of a rectangular rhomb. Reference Y1 denotes a transverse direction parallel to the largest side of that rectangular rhomb, and Z1 denotes a vertical direction parallel to the smallest side of that rhomb. Reference X1 also denotes a longitudinal direction perpendicular to the axes Y1 and Z1. The direction Z1 is oriented from bottom to top, direction X1 is oriented from back to front, and direction Y1 is oriented from right to left.

Reference L1 denotes the length of the measuring device, measured in direction Y1, l1 denotes its width, measured in direction X1, and H1 denotes its height, measured in direction Z1. In particular and as an example, the length L1 is comprised between 100 mm and 200 mm, preferably substantially equal to the width of the electric apparatus in the same direction Y1, for example 150 mm. The width l1 is, for example, comprised between 20 mm and 30 mm, and the height H1 is comprised between 10 mm and 20 mm, preferably equal to 15 mm. The measuring device 1 is then particularly compact, which makes it easier to connect to the electric apparatus.

Figure 5:
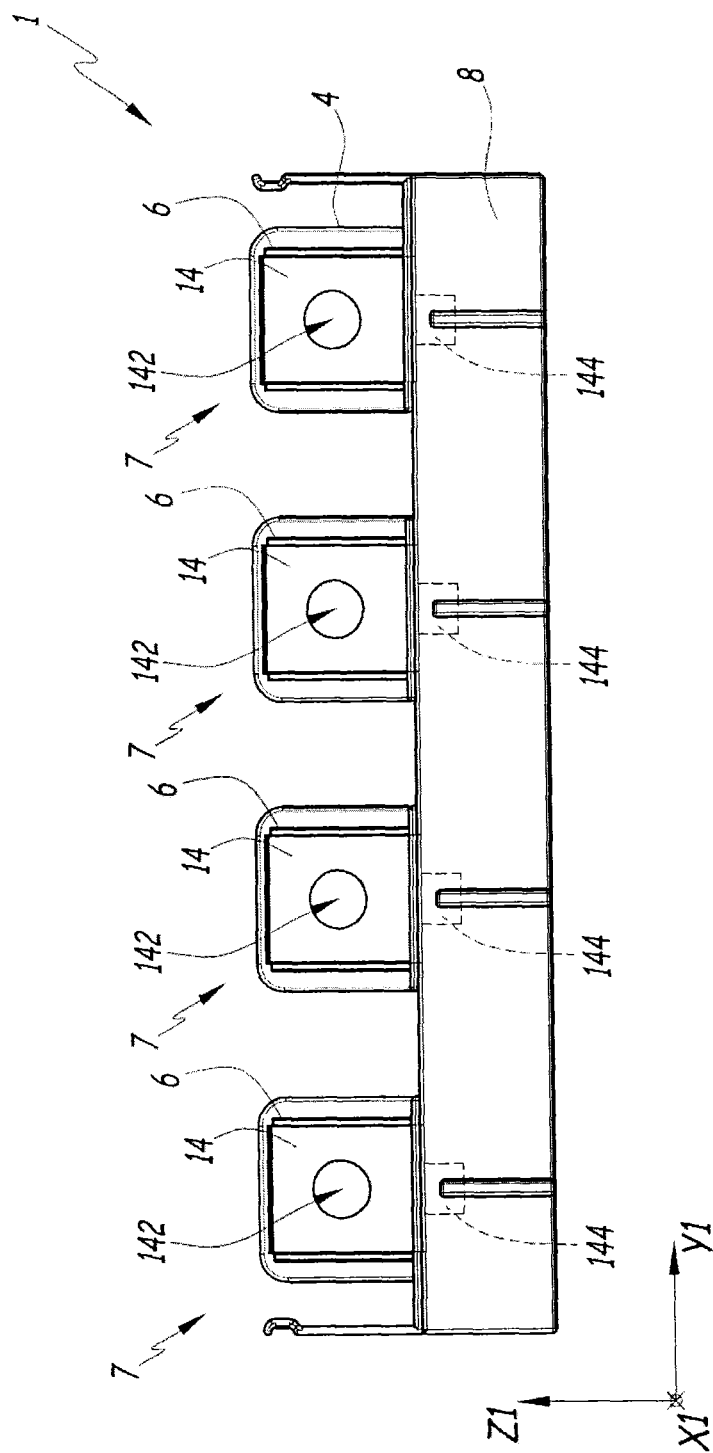
FIG. 5 is a bottom view of the device of FIG. 1.

In a first embodiment of the invention, shown in FIGS. 1 and 5, each current sensor 5 comprises a magnetic circuit 10 and a coil 12, the coil 12 being positioned between two ends 104 of the magnetic circuit. The measuring device 1 then comprises four coils 12, each being associated with a respective spacer 6. The coils 12 are kept in place on a printed circuit 8 by fastening means 122. The coils 12 each comprise a winding 126 positioned between two ends 124 in the form of contact tongues.

The spacers 6 are received in the housing 4 and protrude past the cover 2. The housing 4 and the cover 2 are made from an insulating material, while the spacers 6 are made from an electrically conductive material preferably having a good conductivity, such as copper.

The spacers 6 have a passage section for the current, defined in a plane perpendicular to the direction Z1, which is sized as a function of the rated current of the electric apparatus and the heating not to be exceeded for the electric apparatus, such as the circuit breaker, to which the measuring device 1 is designed to be connected. In practice and for example, for an electric apparatus whose rated current is 250 A, the passage section will be comprised between 10 and 20 mm². Thus, the passage of the current in the spacer 6 does not generate excessive heating. The section of each spacer 6 is for example horseshoe-shaped.

The spacers 6 comprise a passage orifice 62 for a connecting screw, the connecting screw being designed to fasten, to the electric apparatus, both the measuring device 1 and the end of the electric conductor, such as a lug, that is designed to be electrically connected to the electric apparatus via the measuring device 1.

The spacers 6 are preferably all identical and extend in the vertical direction Z1. The spacers 6 are offset and regularly spaced apart from one another in the longitudinal direction X1. They are all oriented in the same direction, such that the opening of each horseshoe is oriented toward the front of the measuring device 1.

The spacers 6 are received in four through orifices 46 arranged to that end in the housing 4. The orifices 46 of the housing 4, provided to receive the spacers 6, have, on their front inner edge, bosses 47 making it possible to orient the spacers 6 and keep them in position.

In the embodiment of FIGS. 1 and 5, each voltage sensor 7 is in the shape of a voltage tap tongue 14. Each tongue 14 comprises an orifice 142 allowing the passage of the connecting screw, also designed to pass through the spacers 6 and fastening both the lug of the electric conductor and the measuring device 1 to the corresponding connecting terminal of the apparatus. The tongues 14 also comprise an end 144 for electrical connection with the printed circuit 8. FIG. 5 illustrates the connection of the metal blades 14 to the printed circuit 8. The electrical connecting ends 144 of the tongues 14 overlap the printed circuit 8 and are fastened thereto.

The printed circuit 8 comprises a lower face 82 on which the electrical connections of the coils 12 and the voltage tap tongues 14 are made. During the use of the measuring device 1, an AC current with a frequency for example equal to 50 Hz travels through the spacers 6. The current variations generate a magnetic field which, by means of the magnetic circuit, creates a potential difference in the coil 12. The coil 12 is thus traveled through by a current designed to power the printed circuit 8.

The printed circuit 8 comprises an upper face 84, and microcontrollers (not shown) connected on the upper face 84. The microcontrollers make it possible, inter alia, to compute electric energies, electric powers and current harmonics for each phase and the neutral from the measured current(s), as well as the measured voltage(s).

Additionally, the printed circuit 8 comprises wireless means, not shown, for sending the measured electric variable or properties, such as the intensity measured by the current sensor 5 and the voltage measured by the voltage sensor 7. The wireless transmission means for example comprise an antenna and a wireless transceiver. The transceiver is configured for sending the measured properties to a remote receiver, via a wireless signal, such as a signal according to the WIFI or ZIGBEE standard.

The electronic components of the printed circuit 8 are provided to work normally at a temperature of 105° C.

The magnetic circuits 10 are U-shaped. The two ends 104 of each magnetic circuit 10 bear against the two ends 124 of a coil 12.

On its front part, the cover 2 has a pad 22 comprising hollows 24 making it possible to facilitate mounting of the lugs, fastened to the end of electric conductors, on an upper face 61 of each spacer 6.

The housing 4 comprises hooks 42 making it possible to fasten the measuring device 1 to the circuit breaker D by elastic fitting. The housing 4 also comprises mistake-proofing ribs 44 preventing it from being installed in a direction other than that provided by the manufacturer. There are four of these ribs 44 fastened to the lower face of the housing 4 and they are regularly spaced apart. Furthermore, they are oriented in the longitudinal direction X1.

The housing 4 also comprises transverse rims 48 and longitudinal rims 49 configured for supporting the printed circuit 8. These rims 48 and 49 make it possible to raise the printed circuit 8 so as optionally to fasten components on its lower face 82 and avoid excessive heating that may damage the printed circuit 8.

The housing 4 comprises a predetermined number of slots 410 making it possible to position the magnetic circuits 10, each around a respective spacer 6. The number of slots 410, magnetic circuits 10, respectively, is equal to the number of poles of the electric apparatus, such as the circuit breaker, to which the measuring device 1 is designed to be connected. A wall 411 of the housing 4 is positioned inside each magnetic circuit 10 and surrounds each spacer 6, thus providing electrical insulation between each magnetic circuit and the corresponding spacer 6.

The housing 4 also comprises slots 414, the dimensions of which are configured for allowing the passage of the tongues 14 serving to measure the voltage.

The measuring device 1 thus adapts easily on pre-existing installations requiring an upgrade.

During a first installation step, the measuring device 1 is fitted on the front face of the circuit breaker and the hooks 42 of the measuring device 1 catch one another, elastically, on the edges of the electric apparatus, such as the circuit breaker. These hooks 42 then make it possible to fasten the measuring device 1 to the circuit breaker. A second step consists, for each spacer 6, of passing a connecting screw through an orifice of the lug of the corresponding electric conductor, through the orifice 62 of the corresponding spacer 6 and through the orifice 142 of the corresponding voltage tap tongue 14 before tightening the screw on the corresponding connection terminal of the circuit breaker.

The connecting screws contribute to the electric connection between the connection terminal of the circuit breaker and the lug of the electric conductor, while ensuring strong mechanical pressure between those parts.

Thus, a single step makes it possible both to electrically and mechanically connect the electric conductor to the connection terminal of the circuit breaker and to fasten the measuring device 1 to the circuit breaker.

In the embodiments shown in FIGS. 6 to 10, the elements similar to those of the first embodiment bear the same references and are not described again.

In a second embodiment of the invention, shown in FIG. 6, the magnetic field generated by the current variations in the spacer 6 of a measuring device 1a is detected by a single magnetic circuit 10a, in the form of a boustrophedon. In other words, the sole magnetic circuit 10a has a crenellated shape, i.e., a zigzag shape.

The magnetic circuit 10a surrounds each spacer 6, as previously described. It surrounds the rear and side faces of each spacer 6 and a coil 12 is positioned across from the front face of each spacer 6. The magnetic circuit 10a has a shape made up of four U's, each being similar to the magnetic circuit 10 previously described. The four U's are aligned in the longitudinal direction X1, and the openings of the U's being oriented forward. The four U's are connected to each other by three connecting bars 106'. The inner ends 104' of each U-shaped part are each connected to a connecting plate 124 with the coils 12.

The magnetic circuit 10a is more cost-effective to produce industrially than the magnetic circuits 10 and has better mechanical strength. It can be made either in the form of a sintered part, or in the form of cut metal sheets stacked on one another.

Figure 9:
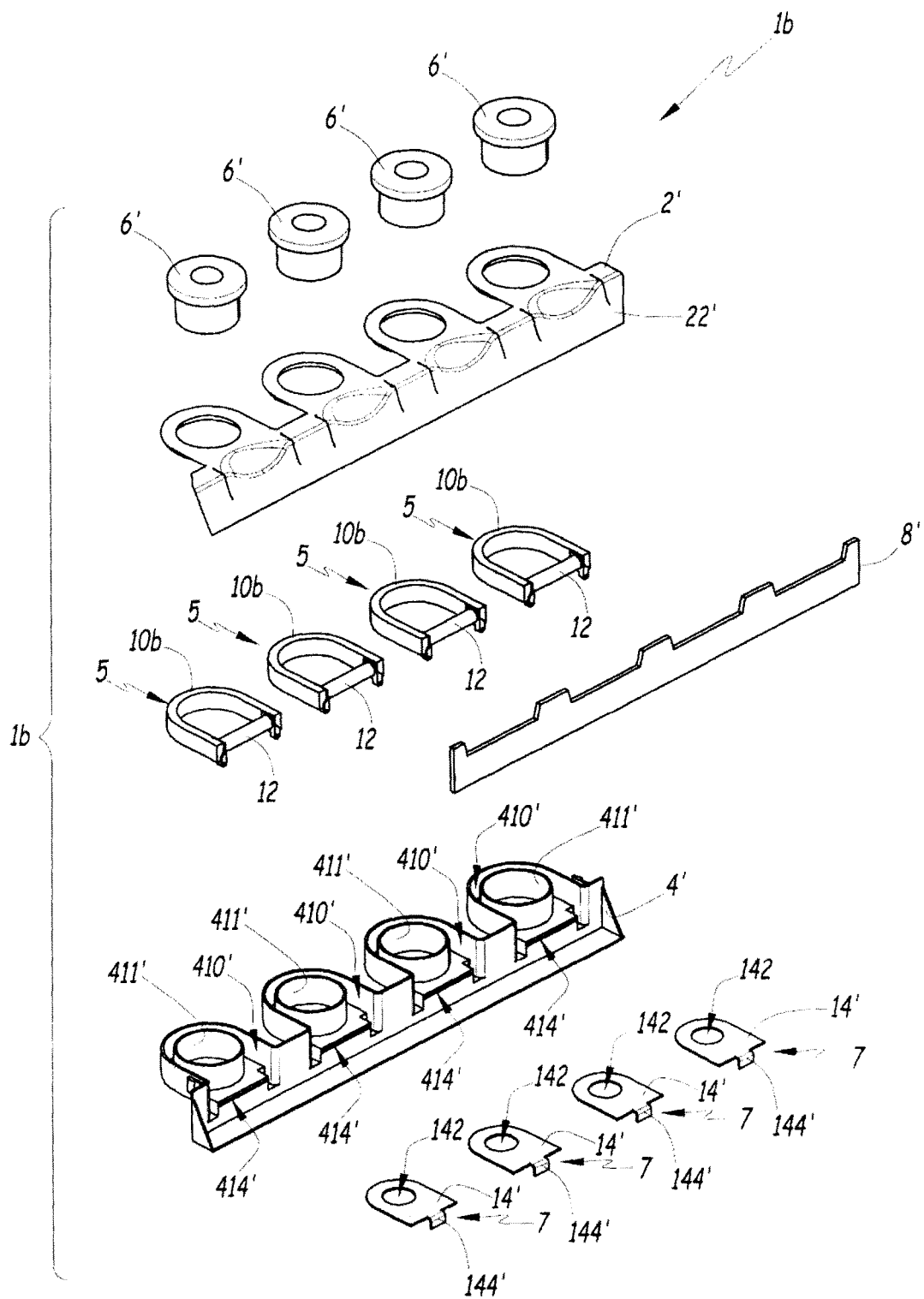
FIG. 9 is a view similar to that of FIG. 3 according to the third embodiment.

In a third embodiment shown in FIGS. 7 to 9, the plate 22' of the protective cover is narrower, and reference l1' denotes the width, L1' the length and H1' the height of the measuring device 1b according to that third embodiment. The width l1' of the measuring device 1b is smaller than the width l1 of the measuring device 1 according to the first embodiment and the length L1' of the measuring device 1b is substantially identical to the length L1 of the measuring device 1 according to the first embodiment, while the height H1' is greater than the height H1 of the measuring device 1 according to the first embodiment. In practice, the length L1' is preferably substantially equal to the width of the electric apparatus in the same direction Y1, for example comprised between 100 and 200 mm, for example 185 mm. The width l1' is for example comprised between 20 and 40 mm and the height H1' is comprised between 20 and 40 mm. Here again, the measuring device 1 is also particularly compact, which facilitates its connection to the electric apparatus.

The pad 22' comprises hollows 24', similar to the hollows 24 of the measuring device 1. The hollows 24' of the measuring device 1b are deeper than the hollows 24 of the measuring device 1. It is thus possible to fasten, on the upper face 61 of the spacers 6, lugs for electric conductors with a larger diameter than in the first embodiment. It is also possible to connect two lugs head-to-tail on a same spacer 6. Furthermore, the fastening hooks 42 are situated more toward the front of the measuring device 1.

In this third embodiment, the spacers 6' are no longer horseshoe-shaped, but in the shape of a cylinder of revolution, around a vertical axis Z6. At their upper end, the spacers 6 comprise a shoulder 64' such that their upper end has a diameter larger than the rest of the spacer. Thus, the spacer abuts against the cover 2' and cannot slide downward along the vertical axis Z6.

Furthermore, in this third embodiment, magnetic circuits 10b surround the spacers 6' and have a partially rounded shape, so as to best hug the shape of the spacers 6'.

The coils 12 are identical to the previous embodiment.

As before, the housing 4' comprises, around each spacer 6', a slot 410' configured for receiving one of the magnetic circuits 10b. Walls 411' provide electrical insulation between each spacer 6' and one of the magnetic circuits 10b. The housing 4' also comprises slots 414', the size of which is adapted to the passage of tongues 14 for the voltage tap. The tongues 14' have a partially rounded shape configured for the shape of the spacers 6' and the housing 4'. As before, the tongues 14' comprise an end 144' making it possible to connect them to a printed circuit 8', and an orifice 142 allowing the passage of a connecting screw, the screw being configured for connecting the lug of the electric conductor and the measuring device 1*b* to the corresponding connecting terminal of the electric apparatus.

In this embodiment, the printed circuit 8' is positioned vertically, along a plane parallel to the transverse Y1 and vertical Z1 directions. The electric power elements, such as the voltage tap tongues 14', and the coils 12 are connected on a rear face of the printed circuit 8, while the electric components making it possible to perform the computations, signal processing, and data transmission are located on a front face of the printed circuit 8'.

Figure 10:
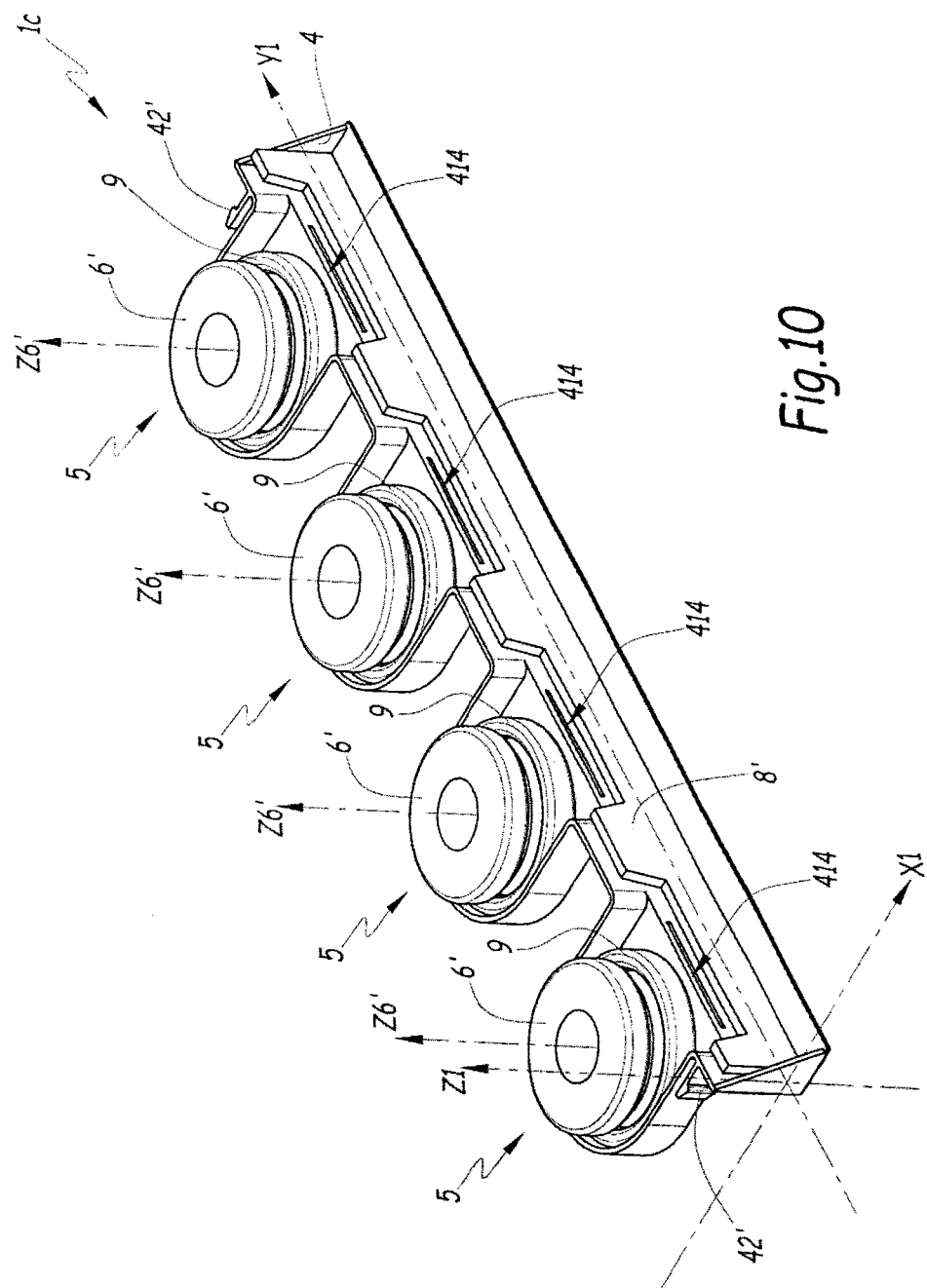
FIG. 10 is a view similar to that of FIG. 4 according to a fourth embodiment of the invention.

In a fourth embodiment of the measuring device 1*c*, shown in FIG. 10, the current sensors 5 comprising the magnetic circuits 10*b* and the coils 12 of the third embodiment are replaced by current sensors 5 in the form of toroids 9. Each current sensor 5 of the measuring device 1*c* is for example in the form of a Rogowski toroid.

As in the third embodiment, the spacers 6' are cylindrical, and each of them is surrounded by a wall 411' providing electrical insulation. Each toroid 9 is positioned around each spacer 6', in a corresponding slot 410'. The electric connection of the toroids 9 to the printed circuit 8' is similar to the connection of the coils 12 to the printed circuit 8, previously described.

In a fifth embodiment, not shown, the current sensor 5 in the form of a toroid 9, such as the toroid of the fourth embodiment, is associated with the other elements of the measuring device 1 according to the first embodiment. Thus, the spacers 6 have a suitable shape, in particular a cylindrical shape. Likewise, the cover 2 and the housing 4 have a shape configured for the passage of the cylindrical spacer 6 and the installation of the current sensor 5 in the form of a toroid. As for the fourth embodiment, each current sensor 5 in the form of a toroid 9 replaces the magnetic circuit 10 and the corresponding coil 12.

In a sixth embodiment, not shown, the magnetic circuit 10*a*, in the form of a boustrophedon, of the second embodiment is associated with the cover 2' and the housing 4' of the third embodiment. Thus, the magnetic circuits 10*b* are replaced by a single magnetic circuit 10*a*.

In other embodiments of the invention, the measuring device is designed to measure electric properties of a current traveling through a single-phase circuit breaker or a three-phase circuit breaker. Thus, the measuring device generally comprises 1 to 4 spacers, similar to those previously described, and each of them has an associated current sensor 5 and voltage sensor 7. Each current sensor 5 is either a Rogowski toroid 9, or a magnetic circuit 10 associated with a coil 12, the magnetic circuits 10 for example being made up of a single part in the form of a boustrophedon. Each voltage sensor 7 comprises a tongue in contact with each spacer 6. Each current 5 and voltage 7 sensor are connected to the printed circuit 8 also comprising computation means for computing, from the intensity of the measured voltage, electric properties, such as the electric energy, the electric power, and the harmonics of the current, as well as wireless means for transmitting the measured and calculated properties.

In the description above and the figures, the electric apparatus is shown by a circuit breaker; however, the electric apparatus may also be another cutoff apparatus such as a switch, a contactor or a disconnect switch. It may also be an electric protection apparatus such as an overload protection, short circuit or differential relay. In other cases, the electric apparatus may also be an auxiliary module of another electric apparatus, such as a terminal or an offboard connecting device.

The invention claimed is:

1. A device for measuring at least one electrical variable of a current intended to flow in an electric apparatus, the electric apparatus comprising at least one connection terminal, each connection terminal being designed to be electrically connected to the end of a corresponding electric conductor, the device comprising at least one current sensor, each current sensor being configured for measuring the current flowing in a corresponding electric conductor,
   wherein the device further comprises at least one electrically conductive spacer, each spacer being configured for being interposed between a respective connection terminal and the end of a corresponding electric conductor, and
   wherein each current sensor is further positioned around a respective spacer, to measure the current flowing through said spacer, between the electric conductor and the corresponding connection terminal.

2. The device according to claim 1, wherein the electric apparatus comprises N connection terminals, N being an integer greater than or equal to 2, and wherein the measuring device comprises N current sensors and N spacers.

3. The device according to claim 1, wherein at least one current sensor comprises a magnetic circuit and a coil, the coil being positioned between two ends of the magnetic circuit.

4. The device according to claim 3, wherein the electric apparatus comprises N connection terminals, N being an integer greater than or equal to 2, and wherein the measuring device comprises N current sensors and N spacers,
   wherein the magnetic circuits are formed by a single piece in the form of a boustrophedon.

5. The device according to claim 1, wherein at least one current sensor comprises a winding coiled in the shape of a toroid.

6. The device according to claim 1, wherein the device comprises at least one voltage sensor configured for measuring the voltage of a corresponding connection terminal.

7. The device according to claim 6, wherein each voltage sensor is in the form of a tongue positioned against a respective spacer.

8. The device according to claim 1, wherein each spacer comprises a passage orifice for a connection member connecting the end of the conductor to the corresponding connection terminal.

9. The device according to claim 1, wherein the device comprises radio means for sending the measured electrical variable(s) to an electronic equipment that is remote from said device.

10. The device according to claim 1, wherein the device comprises elastic fitting means for fitting with complementary means of the electric apparatus, to fasten the device to the electric apparatus.

11. An assembly comprising an electric apparatus, and a device for measuring at least one electric variable of a current intended to flow in the electric apparatus,
    wherein the measuring device is according to claim 1.

12. The assembly according to claim 11, wherein the electric apparatus is an electric cutoff apparatus.

13. The assembly according to claim 11, wherein the electric apparatus is an electric protection apparatus.

14. The assembly according to claim 11, wherein the electric apparatus is an electric circuit breaker.

\* \* \* \* \*